(12) United States Patent
Mori

(10) Patent No.: US 10,578,664 B2
(45) Date of Patent: Mar. 3, 2020

(54) DRIVE CIRCUIT FOR INSULATED-GATE SEMICONDUCTOR ELEMENT

(71) Applicant: FUJI ELECTRIC CO., LTD., Kawasaki (JP)

(72) Inventor: Takahiro Mori, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/050,281

(22) Filed: Jul. 31, 2018

(65) Prior Publication Data

US 2018/0335469 A1 Nov. 22, 2018

Related U.S. Application Data

(63) Continuation of application No. PCT/JP2017/024692, filed on Jul. 5, 2017.

(30) Foreign Application Priority Data

Aug. 29, 2016 (JP) .................................. 2016-167023

(51) Int. Cl.
  *H03K 17/16* (2006.01)
  *G01R 31/26* (2020.01)
  (Continued)

(52) U.S. Cl.
  CPC ..... *G01R 31/2619* (2013.01); *H03K 17/0828* (2013.01); *H03K 17/168* (2013.01);
  (Continued)

(58) Field of Classification Search
  CPC ........... G01R 31/2619; H03K 17/0828; H03K 17/168; H03K 17/567; H03K 17/166; H03K 2017/0806
  (Continued)

(56) References Cited

U.S. PATENT DOCUMENTS 5,980,106 A * 11/1999 Yamamoto ............... G01K 7/01
                                                323/907
8,350,601 B2 * 1/2013 Nagata .................. H03K 17/168
                                                327/108
(Continued)

FOREIGN PATENT DOCUMENTS

CN       101325366 A     12/2008
JP       2003-124796      4/2003
(Continued)

OTHER PUBLICATIONS

International Search Report dated Sep. 5, 2017 in corresponding International Patent Application No. PCT/JP2017/024692.
(Continued)

*Primary Examiner* — Ryan Jager

(57) ABSTRACT

A drive circuit for an insulated-gate semiconductor element includes a current source which generates a current to be supplied to a gate of the insulated-gate semiconductor element, a current output circuit which controls supply of the current generated by the current source to the gate of the insulated-gate semiconductor element in accordance with a drive signal, an output current control circuit which controls a magnitude of the current generated by the current source in accordance with a control voltage according to an operating temperature of the insulated-gate semiconductor element, and a control voltage detection terminal which is provided in the output current control circuit and enables detection of the control voltage from outside.

10 Claims, 5 Drawing Sheets

(51) Int. Cl.
*H03K 17/082* (2006.01)
*H03K 17/567* (2006.01)
*H03K 17/08* (2006.01)

(52) U.S. Cl.
CPC ......... *H03K 17/567* (2013.01); *H03K 17/166* (2013.01); *H03K 2017/0806* (2013.01)

(58) Field of Classification Search
USPC ....................................................... 327/108
See application file for complete search history.

(56) References Cited

U.S. PATENT DOCUMENTS

| | | | | |
|---|---|---|---|---|
| 8,618,845 | B2* | 12/2013 | Hokabira | H03K 17/08 327/108 |
| 8,884,660 | B2* | 11/2014 | Fukuta | H03K 17/00 327/109 |
| 8,970,259 | B2* | 3/2015 | Mori | H03K 17/145 327/108 |
| 9,608,618 | B2* | 3/2017 | Sakai | H03K 17/0828 |
| 9,728,580 | B2* | 8/2017 | Meiser | H01L 27/16 |
| 9,762,117 | B2* | 9/2017 | Sasaki | H02M 1/088 |
| 10,110,115 | B2* | 10/2018 | Fujii | H02H 11/006 |
| 2002/0057125 | A1* | 5/2002 | Demizu | H02M 3/156 327/538 |
| 2004/0212021 | A1* | 10/2004 | Shimizu | H01L 27/088 257/375 |
| 2008/0094111 | A1* | 4/2008 | Nakamori | H03K 17/168 327/108 |
| 2008/0309608 | A1* | 12/2008 | Shen | G09G 3/3696 345/101 |
| 2012/0217937 | A1* | 8/2012 | Miyauchi | H03K 17/0828 322/28 |
| 2012/0242376 | A1* | 9/2012 | Ose | H03K 17/0828 327/109 |
| 2013/0214823 | A1* | 8/2013 | Kawamoto | H02H 9/025 327/109 |
| 2013/0285732 | A1* | 10/2013 | Mori | H03K 17/145 327/378 |
| 2015/0180453 | A1* | 6/2015 | Mori | H02M 1/088 327/109 |
| 2015/0372648 | A1* | 12/2015 | Sugimoto | H04B 10/272 330/2 |
| 2016/0006429 | A1* | 1/2016 | Mori | H02M 1/088 323/312 |
| 2016/0241227 | A1 | 8/2016 | Hirata | |
| 2017/0302262 | A1 | 10/2017 | Hirata | |

FOREIGN PATENT DOCUMENTS

| | | |
|---|---|---|
| JP | 2008-103895 | 5/2008 |
| JP | 2013-219633 | 10/2013 |
| JP | 2014-93836 | 5/2014 |
| JP | 2014-212234 | 11/2014 |
| JP | 2015-15794 | 1/2015 |
| JP | 20169971 A | 1/2016 |
| JP | 2016-77110 | 5/2016 |
| JP | 2016-127435 | 7/2016 |
| WO | WO 2015/071994 A1 | 5/2015 |

OTHER PUBLICATIONS

Written Opinion of the International Searching Authority dated Sep. 5, 2017 in corresponding International Patent Application No. PCT/JP2017/024692.
Japanese Office Action dated Oct. 29, 2019 from Japanese Patent Application No. 2018-536989, 9 pages.

* cited by examiner

DRIVE CIRCUIT FOR INSULATED-GATE SEMICONDUCTOR ELEMENT

CROSS-REFERENCE TO RELATED APPLICATIONS

This application is a Continuation of International Application No. PCT/JP2017/024692, filed on Jul. 5, 2017, which claims benefit of priority to Japanese Patent Application No. 2016-167023, filed on Aug. 29, 2016, the entire contents of which are incorporated herein by reference.

TECHNICAL FIELD

The present invention relates to a drive circuit for an insulated-gate semiconductor element which can easily inspect output current characteristics.

BACKGROUND ART

As a drive circuit for driving on/off an insulated-gate semiconductor element such as an IGBT, for example, as shown in FIG. 5, there is known a drive circuit 1 for an insulated-gate semiconductor element which controls an output current Iout to be supplied to the gate of the IGBT in accordance with a drive signal. The drive circuit 1 schematically includes a current source 3 for generating the output current Iout to be supplied to the gate of the IGBT 2, and a current output circuit 4 for controlling, in accordance with the drive signal, the supply of the output current Iout generated by the current source 3.

Incidentally, the drive circuit 1 includes an output current control circuit 5 for defining a magnitude of the output current Iout outputted from the current source 3. The output current control circuit 5 includes, for example, an operational amplifier OP1 for controlling a current Io flowing through an N-type MOS-FET 5a, and a reference resistor (Rref) 5b for generating a current detection voltage according to the current Io flowing through the MOS-FET 5a. The operational amplifier OP1 plays a role of controlling the gate voltage of the MOS-FET 5a in accordance with a voltage difference between the current detection voltage generated between both terminals of the reference resistor 5b and a predetermined reference voltage Vref, thereby making the current Io flowing through the MOS-FET 5a constant.

The current source 3 is realized as a P-type MOS-FET 3a which constitutes a current mirror circuit in combination with a P-type MOS-FET 5c, which is connected as a load of the MOS-FET 5a to the drain of the MOS-FET 5a, and generates the output current Iout proportional to the current Io.

The current output circuit 4 includes an N-type MOS-FET 4b which is interposed between the gate of the IGBT 2 and the ground (GND) and turned on/off by a buffer 4a which receives the drive signal as input. Further, the current output circuit 4 includes a P-type MOS-FET 4c which is connected in parallel to the MOS-FET 3a constituting the current source 3 and a level shift circuit 4d which turns the MOS-FET 4c on/off in accordance with the drive signal.

When the drive signal is at a high (H) level, the current output circuit 4 turns the MOS-FET 4c on via the level shift circuit 4d, thereby stopping a function of the current mirror circuit and thus stopping the current output from the current source 3, and also turns the MOS-FET 4b on via the buffer 4a. Then, the current output circuit plays a role of discharging an electric charge stored in the gate of the IGBT 2 via the MOS-FET 4b, thereby turning the IGBT 2 off.

When the drive signal is at a low (L) level, the current output circuit 4 turns the MOS-FET 4c off via the level shift circuit 4d, thereby outputting the output current Iout from the current source 3, and also turns the MOS-FET 4b off via the buffer 4a. As a result, the output current Iout from the current source 3 is supplied to the gate of the IGBT 2 to turn the IGBT 2 on. In this manner, the current output circuit 4 controls the turning-on/off of the IGBT 2 in accordance with the drive signal.

The switching characteristics of the IGBT 2 which is driven on/off by the drive circuit 1 change depending on an operating temperature (temperature T) of the IGBT 2. In particular, a switching loss at the time of turning-on of the IGBT 2 is likely affected by the output current Iout supplied to the gate of the IGBT 2 and a change in the operating temperature.

In the conventional drive circuit 1, for example, as disclosed in Patent Document 1, it is proposed that information of the operating temperature of the IGBT 2 is fed back to the current output circuit 4, and the output current Iout generated by the current source 3 is subjected to a feedback control according to the operating temperature of the IGBT 2. By such a feedback control of the output current Iout according to the operating temperature of the IGBT 2, it is possible to achieve the reduction of the switching loss of the IGBT 2 and the reduction of switching noise thereof.

In the case of evaluating the output current characteristics of the drive circuit 1 configured in this manner, a current detection circuit (test device) solely capable of measuring the output current Iout of the drive circuit 1 is required to be used. This kind of current detection circuit (test device) is disclosed in detail in, for example, Patent Document 2, and the like. The current detection circuit (test device) disclosed in Patent Document 2 is configured to sample an output current Iout of a measurement object (drive circuit 1 in this case) and evaluate the magnitude the output current, as shown in FIG. 3.

PRIOR ART DOCUMENT

Patent Document

Patent Document 1: JP-A-2013-219633
Patent Document 2: JP-A-2014-212234

SUMMARY OF THE INVENTION

Problem to be Solved by the Invention

However, in the case of evaluating the output current characteristics of the drive circuit 1 using the current detection circuit (test device) as disclosed in Patent Document 2, the output current Iout of the drive circuit 1 itself is required to be measured directly. Further, since the output current Iout supplied to the gate of the IGBT 2 from the drive circuit 1 is large, in general, the current detection circuit (test device) with a complicated configuration and a large current capacity is forced to be used. Moreover, the output current Iout itself supplied to the gate of the IGBT 2 from the drive circuit 1 is required to be measured directly. Thus, there arises a problem that the output current characteristics of the drive circuit 1 cannot be evaluate easily.

The invention has been made in view of the above circumstances, and an object thereof is to provide a drive circuit for an insulated-gate semiconductor element which has a simple configuration and enables easy evaluation of the output current characteristics of the drive circuit.

Means for Solving the Problem

In order to attain the object described above, a drive circuit for an insulated-gate semiconductor element according to the present invention includes:
a current source which generates a current to be supplied to a gate of the insulated-gate semiconductor element;
a current output circuit which controls supply of the current generated by the current source to the gate of the insulated-gate semiconductor element in accordance with a drive signal;
an output current control circuit which controls a magnitude of the current generated by the current source in accordance with a control voltage according to an operating temperature of the insulated-gate semiconductor element; and
a control voltage detection terminal which is provided in the output current control circuit and enables detection of the control voltage from the outside.

Incidentally, the operating temperature of the insulated-gate semiconductor element is detected, for example, as a temperature detection voltage by a temperature sensor which is provided integrally with the insulated-gate semiconductor element. The output current control circuit, for example, controls a magnitude of the current generated by the current source using, as the control voltage, a voltage difference between the temperature detection voltage and a reference voltage.

Preferably, the output current control circuit generates an output current according to the control voltage. The current source is realized, for example, as a transistor, which constitutes a current mirror circuit in combination with a transistor which forms a load of the output current control circuit, and outputs a current in proportional to the output current of the output current control circuit. Further, the output current control circuit preferably includes, for example, a means for variably setting the reference voltage.

Alternatively, the output current control circuit, for example, discriminates the temperature detection voltage based on a predetermined threshold voltage to generate the control voltage and controls a magnitude of the current generated by the current source according to a voltage difference between the control voltage and a reference voltage. Preferably, the output current control circuit discriminates the temperature detection voltage based on a threshold voltage set in a plurality of steps so as to generate the control voltage in a plurality of steps. Further, preferably, the output current control circuit includes, for example, a means for variably setting the threshold voltage.

In this case, the output current control circuit generates an output current according to a voltage difference between the control voltage and the reference voltage. Even in the case of configuring the output current control circuit in this manner, the current source is also realized as a transistor, which constitutes a current mirror circuit in combination with a transistor which forms a load of the output current control circuit, and outputs a current in proportional to the output current of the output current control circuit.

Effects of the Invention

According to the drive circuit for the insulated-gate semiconductor element configured in this manner, the control voltage for defining the output current, which is supplied to the gate of the insulated-gate semiconductor element from the current source, can be detected easily via the control voltage detection terminal provided in the output current control circuit. In other words, by detecting the control voltage via the control voltage detection terminal, the output current outputted from the drive circuit can be detected indirectly and precisely from the control voltage without directly detecting the output current outputted from the drive circuit.

Accordingly, as compared with the case of directly measuring the output current outputted from the drive circuit, the output current characteristics of the drive circuit can be easily evaluated using, in general, a so-called voltage measuring device having a simple configuration. Further, in the drive circuit, the control voltage detection terminal which enables, from the outside, detection of the control voltage for defining the output current is merely provided newly. Thus, the configuration of the drive circuit is not complicated. Consequently, such numerous practical benefits can be attained that the drive circuit for the insulated-gate semiconductor element which can easily and effectively inspect the output current characteristics of the drive circuit can be provided.

DETAILED DESCRIPTION OF EMBODIMENTS

Hereinafter a drive circuit for an insulated-gate semiconductor element according to the invention will be explained with reference to drawings.

Figure 1:
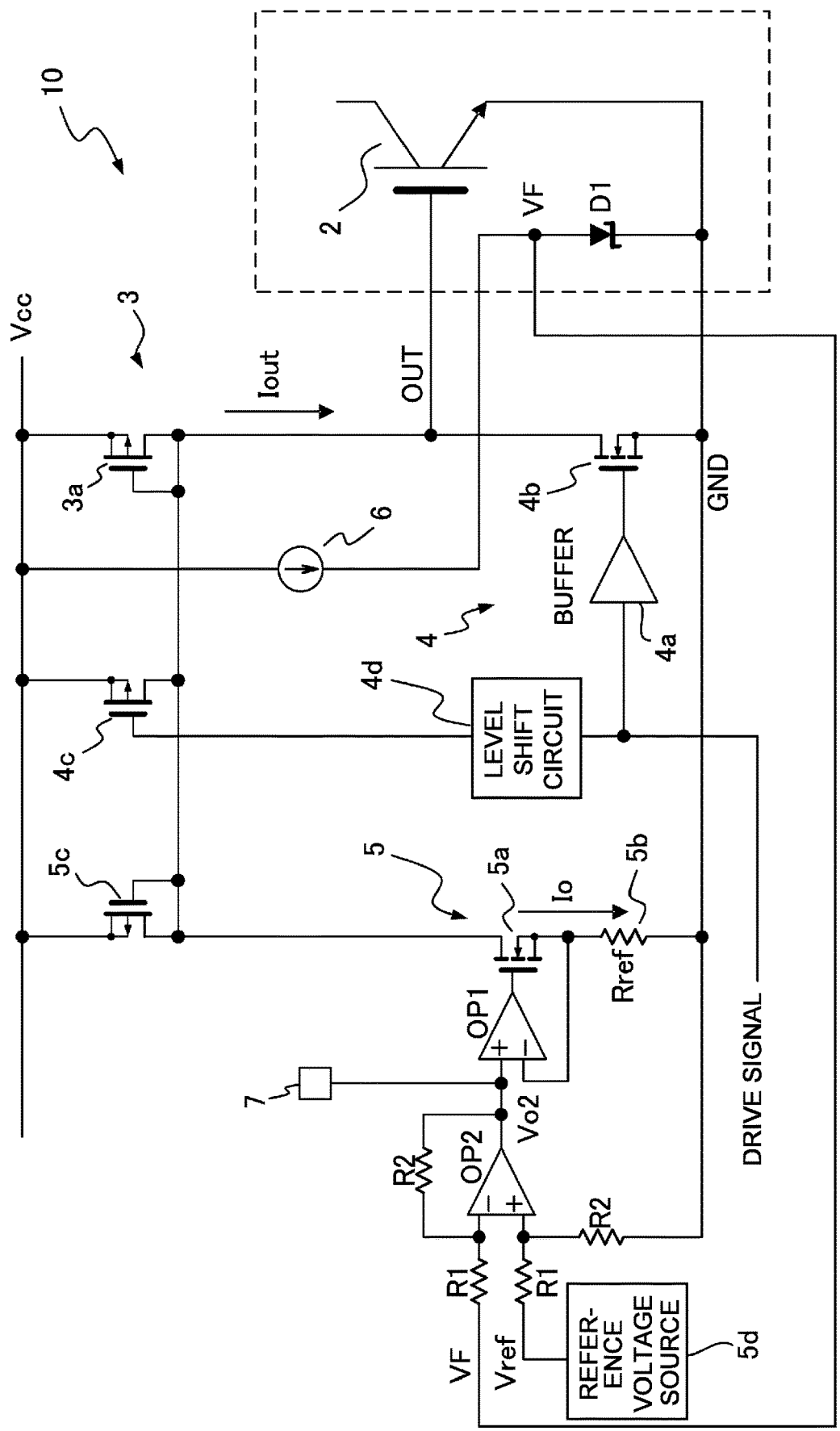
FIG. 1 is a schematic configuration diagram of a drive circuit for an insulated-gate semiconductor element according to an embodiment of the invention.
Figure 5:
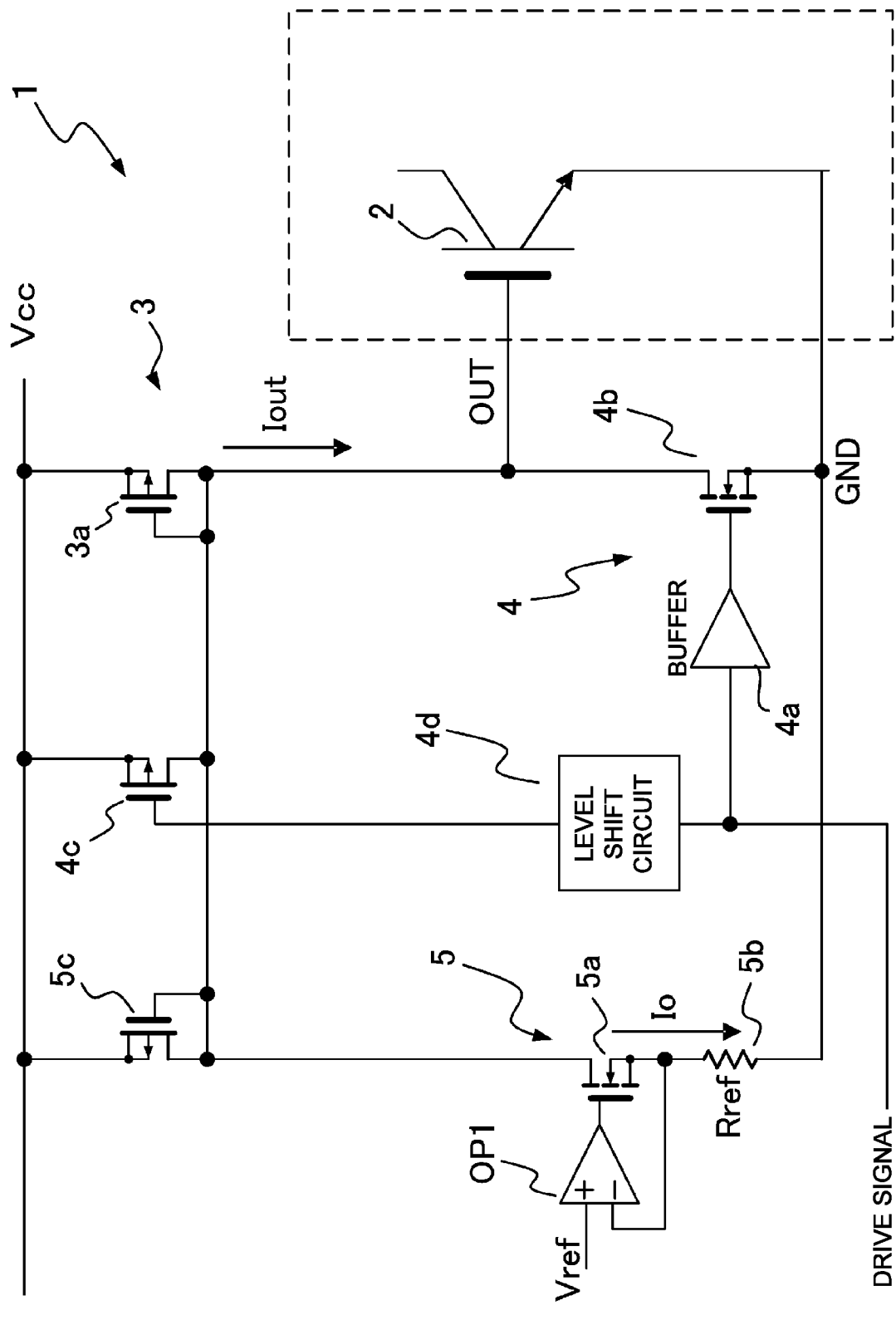
FIG. 5 is a schematic configuration diagram showing a conventional drive circuit for an insulated-gate semiconductor element.

FIG. 1 is a schematic configuration diagram of a drive circuit 10 for an insulated-gate semiconductor element according to an embodiment of the invention. In the figure, constituent portions identical to those of the conventional drive circuit 1 shown in FIG. 5 are referred to by the common symbols, with explanation thereof being omitted.

An IGBT 2 as the insulated-gate semiconductor element is integrated with a diode D1, for example, as a temperature sensor. The drive circuit 10 includes a constant current source 6 for driving the diode D1 with a constant current. The diode D1 is driven by the constant current so as to generate a temperature detection voltage VF according to an operating temperature of the IGBT 2. The temperature detection voltage VF is fed back, as information representing the operating temperature of the IGBT 2, to an output current control circuit 5 of the drive circuit 10.

The output current control circuit 5 includes, in addition to the operational amplifier OP1, the MOS-FET 5*a*, and the reference resistor (Rref) 5*b* described above, an operational amplifier OP2 for detecting a voltage difference between the temperature detection voltage VF representing the operating temperature T and a reference voltage Vref outputted from a reference voltage source 5d. The operational amplifier OP2 is configured such that an inverting input terminal and a non-inverting input terminal thereof are respectively provided with input resistors R1, R1, the non-inverting input terminal is grounded via the resistor R2, and a feedback resistor R2 is interposed between an output terminal and the inverting input terminal of this operational amplifier.

The operational amplifier OP2 constitutes an amplifier which generates a control voltage Vo2 in accordance with the voltage difference between the temperature detection voltage VF and the reference voltage Vref applied via the respective input resistors R1, R1. The control voltage Vo2 outputted from the operational amplifier OP2 is applied to the operational amplifier OP1. A current Io flowing through the MOS-FET 5a is controlled by an output of the operational amplifier OP1. A control voltage detection terminal 7 is connected to a non-inverting input terminal of the operational amplifier OP1 to which the control voltage Vo2 is applied. The control voltage detection terminal 7 enables detection of the control voltage Vo2 from the outside.

The reference voltage source 5d includes, for example, an EPROM of which output is electrically changeable from the outside, and the reference voltage Vref can be variably set in accordance with the output of the EPROM.

According to the drive circuit 10 configured in the aforesaid manner, the temperature detection voltage VF according to the operating temperature T of the IGBT 2 is detected via the diode D1 integrally provided with the IGBT 2, and is fed back to the output current control circuit 5. Then, the output current control circuit 5 generates the control voltage Vo2 according to the voltage difference between the temperature detection voltage VF and the reference voltage Vref, and controls the current Io flowing through the MOS-FET 5a according to a difference between the control voltage Vo2 and a voltage detected via the reference resistor (Rref) 5b. As a result, the current source 3 generates the output current Iout proportional to the current Io which is set by the output current control circuit 5 according to the operating temperature T of the IGBT 2, and supplies the output current Iout to the gate of the IGBT 2.

Figure 2:
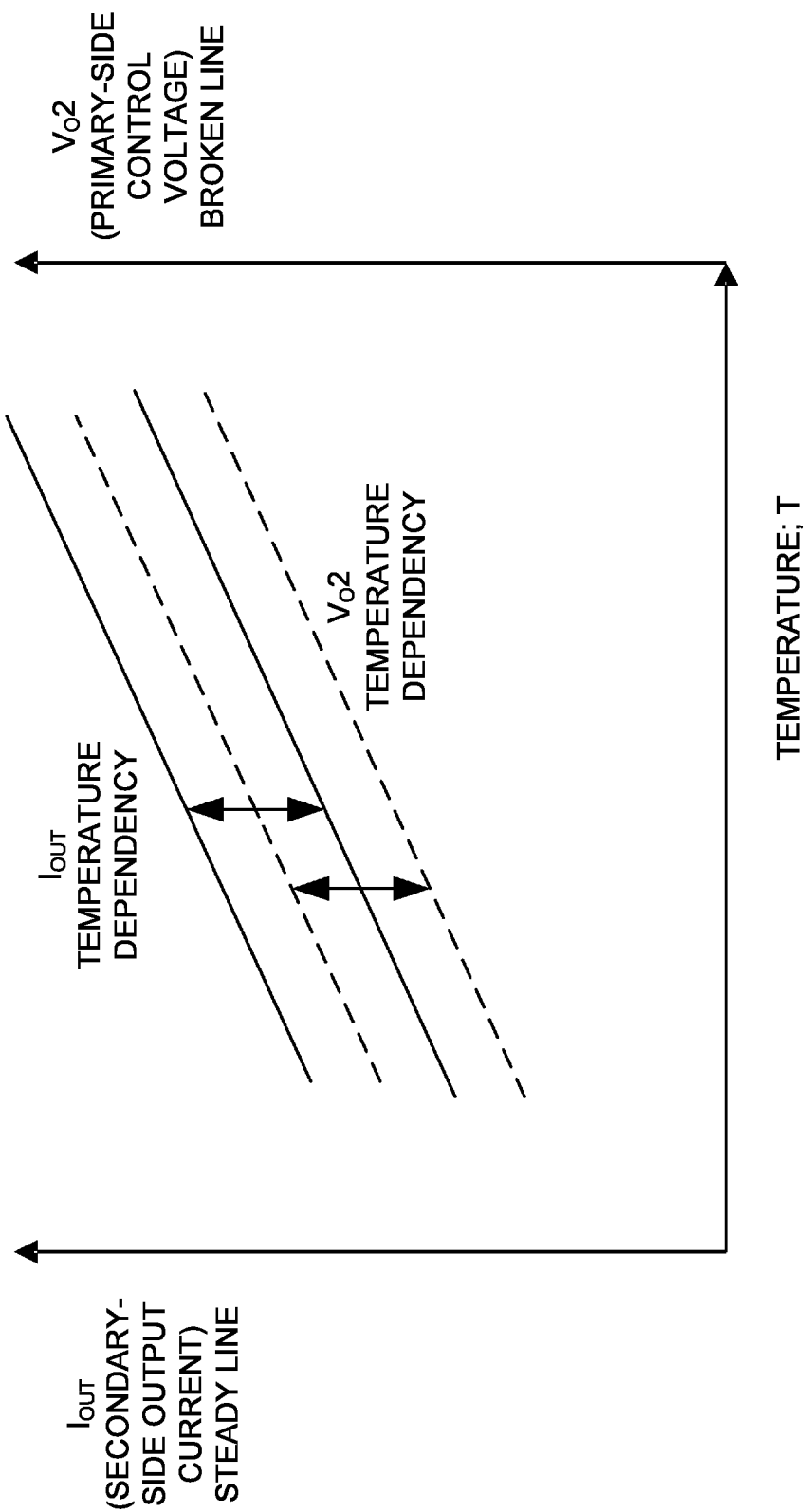
FIG. 2 is a diagram showing temperature characteristics of an output current and a control voltage in the drive circuit shown in FIG. 1.

Thus, as shown in FIG. 2, the output current Iout which is supplied from the current source 3 to the gate of the IGBT 2 is proportional to the current Io set by the output current control circuit 5 according to the operating temperature T of the IGBT 2, that is, the control voltage Vo2 applied to the operational amplifier OP1. Further, each of the output current Iout and the control voltage Vo2 changes according to the operating temperature T of the IGBT 2, and thus represents the temperature characteristics of the IGBT 2 itself.

Thus, the output current Iout generated by the current source 3 is closely related, to each other, to the control voltage Vo2 which defines the current Io set by the output current control circuit 5. Rather, it can be said that the output current Iout is proportional to the control voltage Vo2. Accordingly, when the control voltage Vo2 in the output current control circuit 5 is detected via the control voltage detection terminal 7, the output current Iout can be detected indirectly.

As a result, according to the drive circuit 10 including the control voltage detection terminal 7, the output current Iout outputted from the drive circuit 10 can be measured indirectly using a voltage detection circuit (test device) with a simple configuration, without directly measuring the output current Iout outputted to the gate of the IGBT 2 from the drive circuit 10 using the current detection circuit (test device) with a complicated configuration. Thus, the output current characteristics of the drive circuit 10 can be measured easily.

Further, the proportional relation between the output current Iout and the control voltage Vo2 can also be adjusted as shown by dotted lines in FIG. 2, for example, by changing the reference voltage Vref generated from the reference voltage source 5d according to the measuring result. Thus, if the output current Iout from the current source is variably set by changing the reference voltage Vref, optimization of the driving condition of the IGBT 2 can be achieved and reduction of the switching loss can be achieved. In other word, such an effect can be attained that the output current Iout supplied to the gate of the IGBT 2 is optimized and thus the switching loss at the time of turning-on and off the IGBT 2 can be reduced.

Next, another embodiment of a drive circuit for an insulated-gate semiconductor element according to the invention will be explained.

Figure 3:
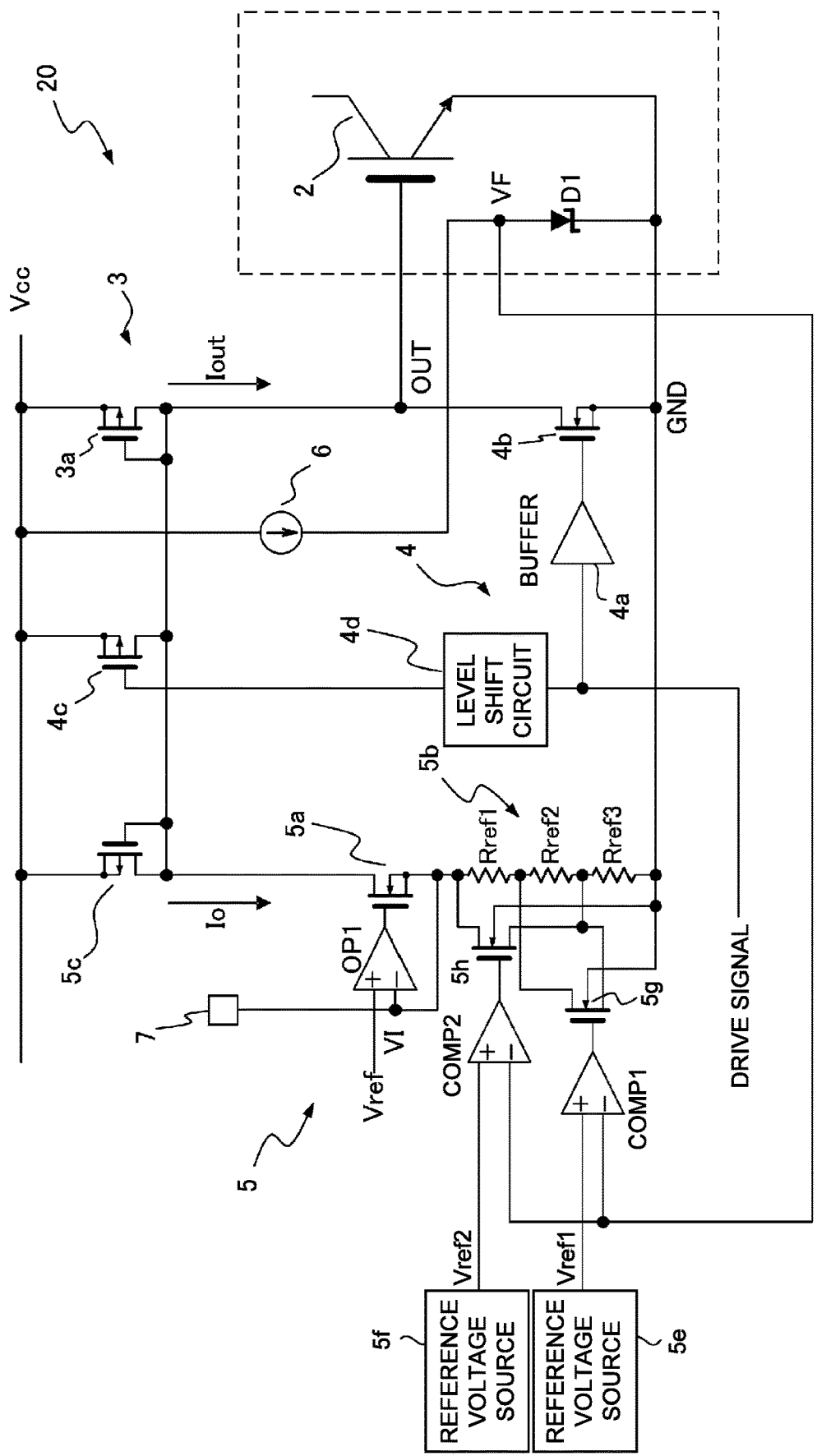
FIG. 3 is a schematic configuration diagram of a drive circuit for an insulated-gate semiconductor element according to another embodiment of the invention.

FIG. 3 is a schematic configuration diagram of a drive circuit 20 for an insulated-gate semiconductor element according to another embodiment of the invention. Also in the explanation of this embodiment, constituent portions identical to those of conventional the drive circuit 1 shown in FIG. 5 and the drive circuit 10 of the embodiment according to the invention shown in FIG. 1 are referred to by the common symbols, with explanation thereof being omitted.

The drive circuit 20 according to this embodiment includes, as the output current control circuit 5, first and second comparators COMP1, COMP2 which compare the temperature detection voltage VF according to the operating temperature T of the IGBT 2, which is detected via the diode D1 integrally provided with the IGBT 2, with first and second threshold voltages Vref1, Vref2, respectively. Incidentally, the first threshold voltage Vref1 corresponds to a temperature Ta and the second threshold voltage Vref2 corresponds to a temperature Tb (>Ta). The first and second threshold voltages Vref1, Vref2 are respectively generated from reference voltage sources 5e, 5f, and set so as to be, for example, [Vref1>Vref2]. Similarly to the reference voltage source 5d of the embodiment described above, the reference voltage sources 5e, 5f are also configured to variably set individually the first and second threshold voltages Vref1, Vref2, respectively The first and second comparators COMP1, COMP2 turn N-type MOS-FETs 5g, 5h on/off in accordance with comparison results between the temperature detection voltage VF and the first and second threshold voltages Vref1, Vref2, respectively. Incidentally, the MOS-FETs 5g, 5h play a role of short-circuiting, in a reference resistor 5b formed of three resistors Rref1, Rref2, Rref3 connected in series, the resistors Rref1, Rref2 or the resistor Rref2.

Specifically, when the temperature T is T<Ta that is, when the temperature detection voltage VF is larger than the first threshold voltage Vref1, the MOS-FETs 5g, 5h are each kept in an off state by the respective outputs from the first and second comparators COMP1, COMP2. As a result, the sum (Rref1+Rref2+Rref3) of the resistors Rref1, Rref2, Rref3 connected in series is set as the reference resistor 5b.

In contrast, when the temperature T is Ta<T<Tb that is, when the temperature detection voltage VF is smaller than the first threshold voltage Vref1 and larger than the second threshold voltage Vref2, the MOS-FET 5g is turned on by the outputs from the first and second comparators COMP1, COMP2. Thus, the resistor Rref2 is short-circuited according to the turning-on of the MOS-FET 5g. As a result, the sum (Rref1+Rref3) of the resistors Rref1, Rref3 connected in series is set as the reference resistor 5*b*.

When the temperature T is T>Tb that is, the temperature detection voltage VF is smaller than the second threshold voltage Vref2, the MOS-FETs 5*g*, 5*h* are each turned on by the respective outputs from the first and second comparators COMP1, COMP2. As a result, the resistors Rref1, Rref2 are each short-circuited, and the resistor Rref3 is set as the reference resistor 5*b*. Consequently, the MOS-FETs 5*g*, 5*h* are turned on/off in accordance with the temperature detection voltage VF representing the operating temperature T under the control of the first and second comparators COMP1, COMP2, whereby the resistance value of the reference resistor 5*b* is changed stepwise.

Figure 4:
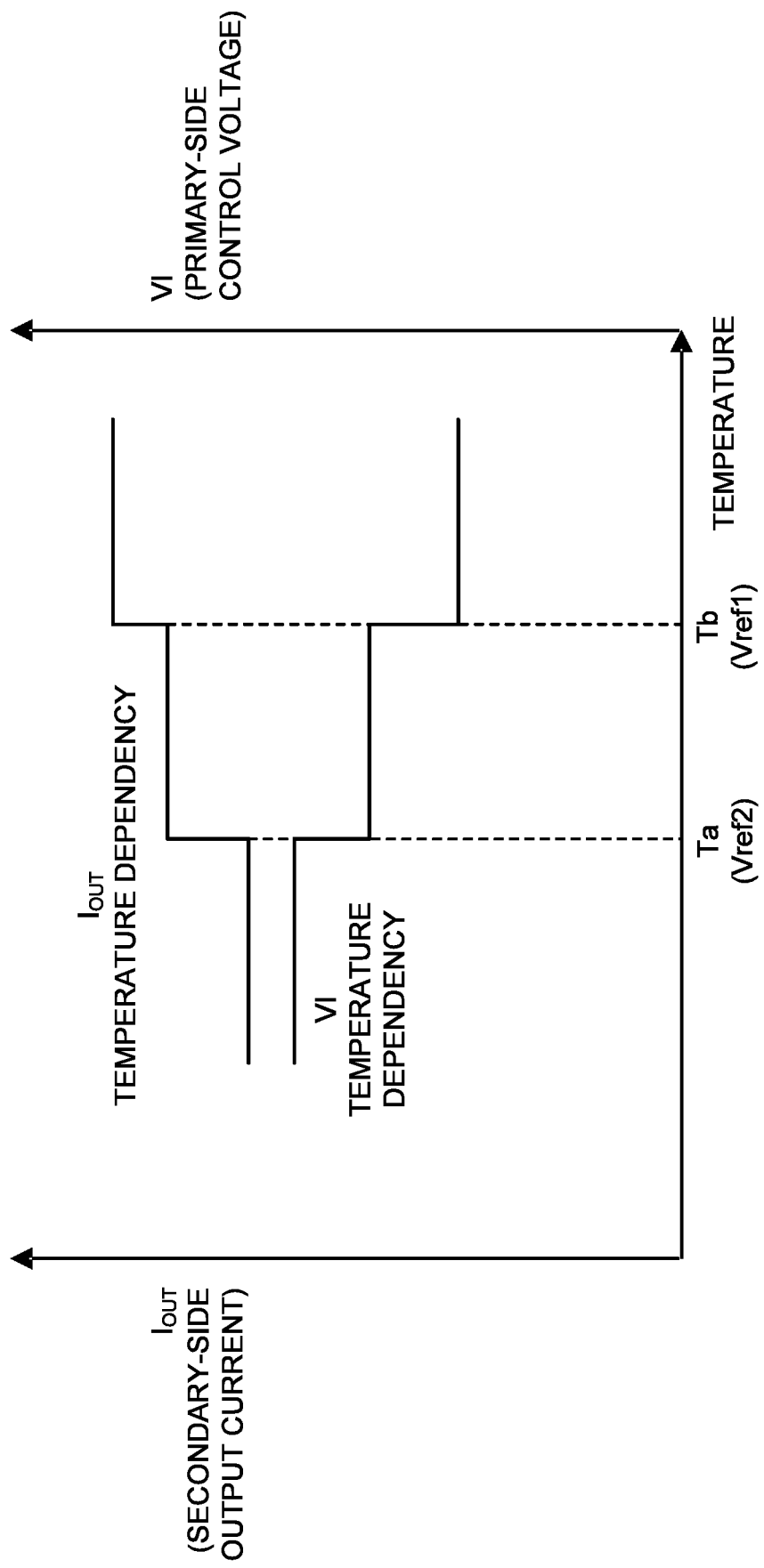
FIG. 4 is a diagram showing temperature characteristics of an output current and a control voltage in the drive circuit shown in FIG. 3.

Specifically, the resistance value of the reference resistor 5*b* is set to decrease stepwise as the temperature detection voltage VF representing the operating temperature of the IGBT 2 increases. A voltage VI generated between the both terminals of the reference resistor 5*b* decreases stepwise as shown in FIG. 4 according to the change of the resistance value of the reference resistor 5*b*. The voltage VI is applied to the inverting input terminal of the operational amplifier OP1 as a control voltage. Then, the operational amplifier OP1 controls the gate voltage of the MOS-FET 5*a* so that a voltage difference between the reference voltage Vref applied to the non-inverting input terminal thereof and the voltage (control voltage) VI becomes zero (0).

Consequently, when the temperature detection voltage VF representing the operating temperature T of the IGBT 2 increases and the voltage (control voltage) VI decreases along with the increase of the temperature detection voltage, the operational amplifier OP1 operates so that the current Io flowing through the MOS-FET 5*a* increases in association with the decrease of the control voltage. In other words, the operational amplifier OP1 performs the control so that the current Io flowing through the MOS-FET 5*a* increases in correspondence to the reduced set value of the resistance of the reference resistor 5*b*. Thus, the output current Iout of the current source 3 is set to be large as the current Io flowing through the MOS-FET 5*a* is set to be large.

In contrast, when the temperature detection voltage VF representing the operating temperature of the IGBT 2 decreases and the voltage (control voltage) VI increases along with the decrease of the temperature detection voltage, the operational amplifier OP1 operates so that the current Io flowing through the MOS-FET 5*a* decreases in association with the increase of the control voltage. In other words, the operational amplifier OP1 performs the control so that the current Io flowing through the MOS-FET 5*a* decreases in correspondence to the increased set value of the resistance of the reference resistor 5*b*. Thus, the output current Iout of the current source 3 is set to be small as the current Io flowing through the MOS-FET 5*a* is set to be small.

Therefore, as shown in FIG. 4, the output current Iout of the current source 3 which changes in accordance with the operating temperature of the IGBT 2 has a one-to-one close correspondence relation with the control voltage VI which is set according to the temperature detection voltage VF representing the operating temperature of the IGBT 2 and applied to the output current control circuit 5. The drive circuit 20 is provided with the control voltage detection terminal 7 which enables, from the outside, detection of the control voltage VI applied to the inverting input terminal of the operational amplifier OP1.

Thus, when the control voltage VI is detected via the control voltage detection terminal 7, the output current Iout of the current source 3 can be detected indirectly from the detected control voltage VI. Accordingly, similarity to the previous embodiment, the output current Iout outputted from the drive circuit 20 can be detected using the voltage detection circuit (test device) with a simple configuration, and thus the output current characteristics of the drive circuit 20 can be measured easily.

Further, for example, if the first and second threshold voltages Vref1, Vref2 generated from the respective reference voltage sources 5*e*, 5*f* are changed according to the measuring result, the temperature characteristics of the output current Iout and the control voltage VI can be adjusted as shown in FIG. 4. Moreover, these temperature characteristics can be approximated to the actual temperature characteristics of the IGBT 2 more precisely.

Accordingly, if the output current Iout from the current source 3 is variably set according to the actual temperature characteristics of the IGBT 2 by changing the threshold voltages Vref1, Vref2, optimization of the driving condition of the IGBT 2 can be achieved and thus reduction of the switching loss can be achieved. In other word, such an effect can be attained that the output current Iout supplied to the gate of the IGBT 2 is optimized and thus the switching loss at the time of turning-on and off the IGBT 2 can be reduced.

The present invention is not limited to the embodiments described above. For example, in the embodiment shown in FIG. 3, the temperature detection voltage VF representing the operating temperature of the IGBT 2 is detected in three steps using the first and second comparators COMP1, COMP2. Further, the temperature detection voltage VF can of course be detected in a plurality of steps. Also, as for the configuration of the drive circuits 10, 20 themselves, various kinds of drive circuits of current-output type having been proposed can be suitably employed. Moreover, the present invention can also be applied in the similar manner to a drive circuit for driving on/off not only the IGBT but also the power MOS-FET as the insulated-gate semiconductor element. The present invention can be implemented so as to be changed in various manners in a range not departing from the gist of the invention.

REFERENCE SIGN LIST 1, 10, 20 drive circuit
2 insulated-gate semiconductor element
3 current source
4 current output circuit
5 output current control circuit
5*d* reference voltage source (reference voltage Vref)
5*e*, 5*f* reference voltage source (threshold voltage Vref1, Vref2)
5*g*, 5*h* N-type MOS-FET
6 constant current source
7 control voltage detection terminal

The invention claimed is:

1. A drive circuit for an insulated-gate semiconductor element, comprising:
a current source which generates a current to be supplied to a gate of the insulated-gate semiconductor element;
a current output circuit which controls supply of the current generated by the current source to the gate of the insulated-gate semiconductor element in accordance with a drive signal;
an output current control circuit which controls a magnitude of the current generated by the current source in accordance with a control voltage generated according to a voltage difference between a temperature detection voltage, which corresponds to an operating temperature of the insulated-gate semiconductor element, and a reference voltage; and a control voltage detection terminal which is provided in the output current control circuit and connected to an input terminal of an operational amplifier of the output current control circuit to which the control voltage is applied, and enables detection of the control voltage from outside to indirectly detect the current to be supplied to the gate of the insulated-gate semiconductor element, wherein the output current control circuit is configured to adjust the reference voltage according to the detection of the control voltage at the control voltage detection terminal to optimize a driving condition of the insulated-gate semiconductor element.

2. The drive circuit for the insulated-gate semiconductor element according to claim 1, wherein the operating temperature of the insulated-gate semiconductor element is detected as the temperature detection voltage by a temperature sensor which is provided integrally with the insulated-gate semiconductor element, and wherein the output current control circuit controls the magnitude of the current generated by the current source using, as the control voltage, a voltage difference between the temperature detection voltage and the reference voltage.

3. The drive circuit for the insulated-gate semiconductor element according to claim 2, wherein the output current control circuit includes a reference voltage source which is configured to variably set the reference voltage.

4. The drive circuit for the insulated-gate semiconductor element according to claim 3, wherein the reference voltage source includes an EPROM, and the reference voltage is variably set according to an output of the EPROM.

5. The drive circuit for the insulated-gate semiconductor element according to claim 1, wherein the output current control circuit generates an output current according to the control voltage, and wherein the current source includes a transistor, which constitutes a current mirror circuit in combination with a transistor which forms a load of the output current control circuit, and outputs a current in proportional to the output current of the output current control circuit.

6. The drive circuit for the insulated-gate semiconductor element according to claim 1, wherein the operating temperature of the insulated-gate semiconductor element is detected as the temperature detection voltage via a temperature sensor which is provided integrally with the insulated-gate semiconductor element, and wherein the output current control circuit discriminates the temperature detection voltage based on a predetermined threshold voltage to generate the control voltage, and controls a magnitude of the current generated by the current source according to a voltage difference between the control voltage and the reference voltage.

7. The drive circuit for the insulated-gate semiconductor element according to claim 6, wherein the output current control circuit includes a reference voltage source which is configured to variably set the threshold voltage.

8. The drive circuit for the insulated-gate semiconductor element according to claim 7, wherein the output current control circuit discriminates the temperature detection voltage based on a threshold voltage set in a plurality of steps so as to generate the control voltage in a plurality of steps.

9. The drive circuit for the insulated-gate semiconductor element according to claim 6, wherein the output current control circuit generates an output current according to the voltage difference between the control voltage and the reference voltage, and wherein the current source includes a transistor, which constitutes a current mirror circuit in combination with a transistor which forms a load of the output current control circuit, and outputs a current in proportional to the output current of the output current control circuit.

10. The drive circuit for the insulated-gate semiconductor element according to claim 1, wherein the output current control circuit further includes another operational amplifier which detects the voltage difference between the temperature detection voltage and the reference voltage which is output from a reference voltage source, and which generates the control voltage applied to the operational amplifier, and the temperature detection voltage represents the operating temperature of the insulated-gate semiconductor element.

* * * * *